(12) United States Patent
Fukunaga et al.

(10) Patent No.: US 9,818,696 B1
(45) Date of Patent: Nov. 14, 2017

(54) SEMICONDUCTOR DEVICE

(71) Applicant: SANKEN ELECTRIC CO., LTD., Niiza-shi, Saitama (JP)

(72) Inventors: Shunsuke Fukunaga, Niiza (JP); Taro Kondo, Niiza (JP); Shinji Kudo, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 15/390,675

(22) Filed: Dec. 26, 2016

(51) Int. Cl.
| | |
|---|---|
| H01L 23/52 | (2006.01) |
| H01L 23/532 | (2006.01) |
| H01L 23/522 | (2006.01) |
| H01L 29/78 | (2006.01) |
| H01L 29/739 | (2006.01) |
| H01L 29/40 | (2006.01) |
| H01L 29/423 | (2006.01) |
| H01L 29/45 | (2006.01) |
| H01L 29/417 | (2006.01) |
| H01L 29/16 | (2006.01) |
| H01L 29/20 | (2006.01) |

(52) U.S. Cl.
CPC .... *H01L 23/53271* (2013.01); *H01L 23/5226* (2013.01); *H01L 23/53209* (2013.01); *H01L 23/53266* (2013.01); *H01L 29/407* (2013.01); *H01L 29/41741* (2013.01); *H01L 29/4236* (2013.01); *H01L 29/45* (2013.01); *H01L 29/7397* (2013.01); *H01L 29/7827* (2013.01); *H01L 29/1608* (2013.01); *H01L 29/2003* (2013.01); *H01L 29/452* (2013.01)

(58) Field of Classification Search
CPC ............... H01L 29/7827; H01L 29/407; H01L 29/41741; H01L 29/4236; H01L 29/7397; H01L 23/5226; H01L 23/53271
USPC ........................................................ 257/746
See application file for complete search history.

(56) References Cited

U.S. PATENT DOCUMENTS

| | | | | |
|---|---|---|---|---|
| 7,880,226 B2 * | 2/2011 | Hiller | .................. | H01L 29/0615 257/330 |
| 8,558,308 B1 * | 10/2013 | Blank | ............... | H01L 29/66348 257/335 |
| 2015/0137177 A1 | 5/2015 | Hutzler et al. | | |

* cited by examiner

*Primary Examiner* — Luan C Thai
(74) *Attorney, Agent, or Firm* — Banner & Witcoff, Ltd.

(57) ABSTRACT

A semiconductor device includes: a trench; a first electrode is formed in the trench; a first impurity region, which has a first conductivity type and is formed to abut on the trench; a second impurity region, which has a second conductivity type and is formed to abut the trench; an insulating film, which is formed on the front surface of the semiconductor substrate; a conductive plug, which is formed to penetrate through the insulating film and is electrically connected to the first impurity region and the second impurity region; wherein the conductive plug includes: a silicon layer made of silicon other than a single crystal; a silicide crystallite contained in the silicon layer; and a blocking layer that is formed to cover sides of the silicon layer and is made of a material that is impervious to the silicide crystallites.

8 Claims, 4 Drawing Sheets

SEMICONDUCTOR DEVICE

TECHNICAL FIELD

This disclosure relates to a semiconductor device.

BACKGROUND

There is a semiconductor device such as a power metal-oxide-semiconductor field-effect transistor (MOSFET) or an insulated gate bipolar transistor (IGBT) in which a gate electrode and a gate insulating film are formed on an inner wall of a trench formed in a front surface of a semiconductor substrate.

A semiconductor device having an MOSFET of a trench structure is disclosed in US 2015/0137177. The semiconductor device includes polysilicon plugs, which contains silicide crystallites and are connected to a source region and a body region of the MOSFET, the silicide crystallites are diffused into a semiconductor substrate by heating, and thus a lifetime killer is introduced to increase a switching speed.

SUMMARY

The polysilicon plugs of the semiconductor device disclosed in US 2015/0137177 come in direct contact with an interlayer insulating film, or the like, formed on the semiconductor substrate. Accordingly, the silicide crystallites are diffused from the contact portion, and thus it is difficult to adjust the amount of silicide crystallites to be diffused into the semiconductor substrate. In addition, the silicide crystallites are diffused into the interlayer insulating film, and thus properties of the interlayer insulating film may be changed and may affects characteristics of the semiconductor device.

This disclosure is to provide a semiconductor device in which characteristics can be stabilized and carrier lifetime can be easily shortened.

A semiconductor device of this disclosure includes: a trench, which is formed on a front surface of a semiconductor substrate; a first electrode, which is formed in the trench; a first impurity region, which has a first conductivity type and is formed to abut on the trench, in the front surface of the semiconductor substrate; a second impurity region, which has a second conductivity type and is formed to abut the trench, below the first impurity region, the second conductivity type being opposite to the first conductivity type; an insulating film, which is formed on the front surface of the semiconductor substrate; a conductive plug, which is formed to penetrate through the insulating film and is electrically connected to the first impurity region and the second impurity region; and a second electrode, which is formed on the conductive plug and is electrically connected to the conductive plug. The conductive plug includes: a silicon layer made of silicon other than a single crystal; a silicide crystallite contained in the silicon layer; and a blocking layer that is formed to cover sides of the silicon layer and is made of a material that is impervious to the silicide crystallites.

According to this disclosure, it is possible to provide a semiconductor device in which characteristics can be stabilized and carrier lifetime can be easily shortened.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Embodiments of this disclosure will be described below with reference to the accompanying drawing.

Figure 1:
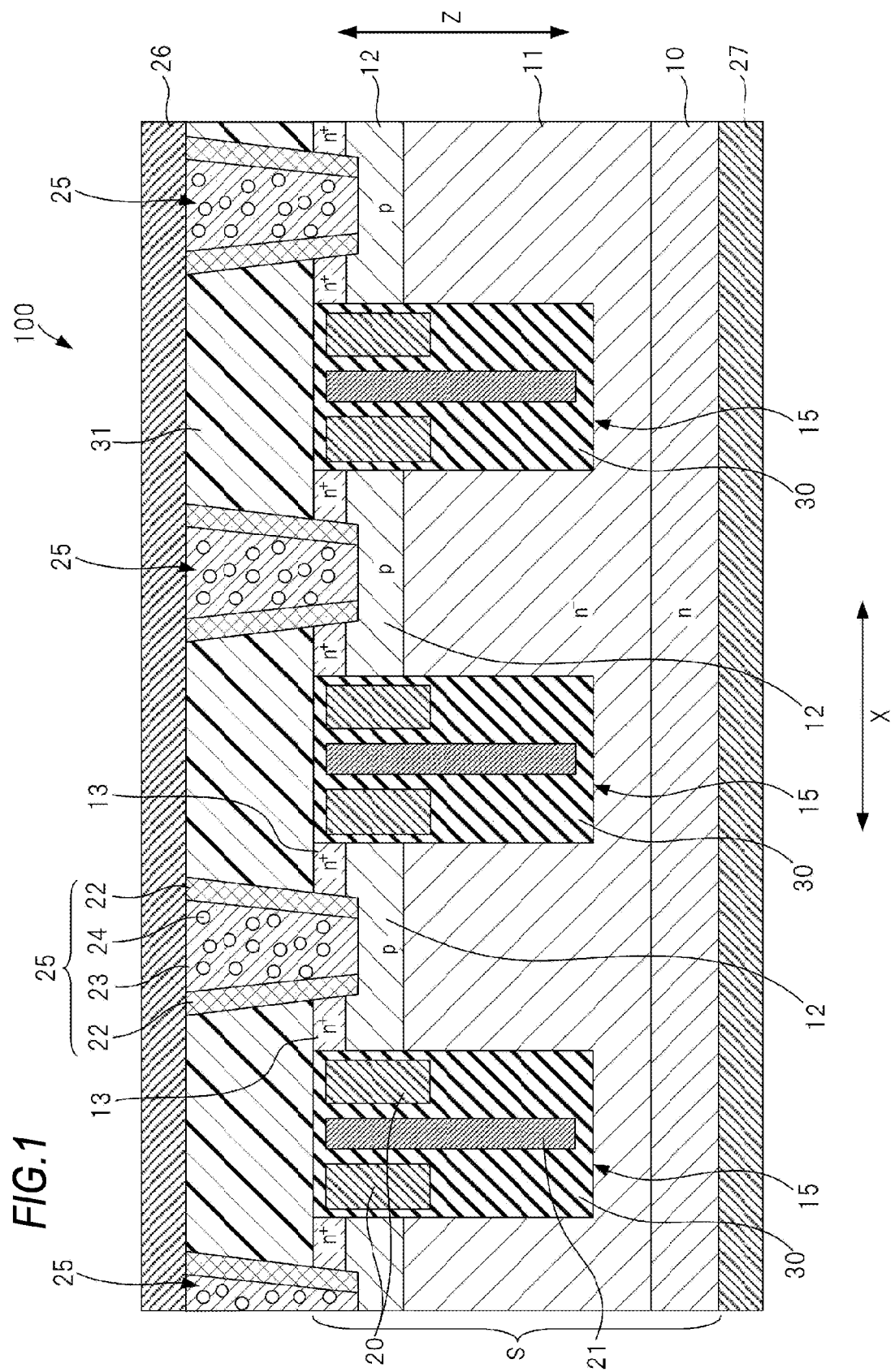
FIG. 1 is a schematic cross-sectional view illustrating partially a schematic configuration of a semiconductor device 100 according to a first embodiment of this disclosure.

FIG. 1 is a schematic cross-sectional view illustrating partially a schematic configuration of a semiconductor device 100 according to a first embodiment of this disclosure.

The semiconductor device 100 has a configuration in which a plurality of MOSFETs having a trench structure are arranged in one direction X. The semiconductor device 100 includes at least one MOSFET.

The semiconductor device 100 includes a semiconductor substrate S made of a semiconductor such as silicon, silicon carbide (SiC), or gallium nitride (GaN). The material of the semiconductor substrate S is not limited thereto.

The semiconductor substrate S includes a front surface serving as an upper surface in FIG. 1 and a back surface serving as a lower surface in FIG. 1. In the following description, out of a thickness direction Z being an aligned direction of the back surface and the front surface of the semiconductor substrate S, a direction toward the front surface from the back surface is defined as an upward direction, and a direction toward the back surface from the front surface is defined as a downward direction.

The semiconductor substrate S includes an n-type substrate 10, an n-type drift region 11 that is formed on the substrate 10 and has a lower impurity concentration than the substrate 10, a body region 12 that is formed on the drift region 11 and includes a p-type impurity region, and a source region 13 that is formed on the surface of the body region 12 and includes an n-type impurity region having a higher impurity concentration than the drift region 11. Each of the drift region 11 and the body region 12 may be configured to have a structure in which a plurality of layers having different impurity concentrations are laminated, respectively.

The source region 13 constitutes a first impurity region. The body region 12 constitutes a second impurity region.

The semiconductor device 100 also includes a plurality of trenches 15 that are formed side by side in the direction X on the front surface of the semiconductor substrate S.

The trench 15 reaches the interior of the drift region 11 from the front surface of the semiconductor substrate S, and extends in a direction perpendicular to each of the direction X and the thickness direction Z.

In the trench 15, a field plate electrode 21 is formed at a central portion in the direction X, and gate electrodes 20 being a first electrode are formed with the field plate electrode 21 interposed therebetween. In addition, an insulating film 30 is formed between an inner wall of the trench 15 and the field plate electrode 21 and the gate electrode 20. In the trench 15, the field plate electrode 21 is not essential and may be omitted.

The p-type body region 12 is formed between two trenches 15 adjacent to each other on the front surface of the semiconductor substrate S. A lower end of each of the gate electrodes 20 formed in two trenches 15 with the body region 12 interposed therebetween is located below a lower end of the body region 12.

On a surface of the body region 12 formed between two trenches 15 adjacent to each other, source regions 13 is formed to abut on each of the trenches 15. The two source regions 13 are formed separately from each other in the direction X, and have the same impurity concentration.

The semiconductor device 100 also includes a drain electrode 27 made of a metal such as aluminum or a metal alloy that is formed on the back surface of the semiconductor substrate S, an interlayer insulating film 31 including a BPSG (Boron Phosphorus Silicon Glass) film or a PSG film that is formed on the front surface of the semiconductor substrate S, a conductive plug 25 that reaches the interior of the semiconductor substrate S by penetrating through the interlayer insulating film 31, and a source electrode 26 that is made of a metal such as aluminum or a metal alloy and is formed on a surface of the interlayer insulating film 31.

The source electrode 26 is electrically connected to the conductive plug 25. The source electrode 26 constitutes a second electrode.

In the trench 15, the gate electrode 20 is formed at an overlapping position with the body region 12 when viewed in the direction X, and thus an applied voltage is controlled. The gate electrode 20 is made of a conductive material such as a metal, a metal alloy, or polysilicon.

By the control of the voltage to be applied to the gate electrode 20, a channel is formed in the body region 12 adjacent to the trench 15, and charges can be transferred to the drain electrode 27 from the source region 13 adjacent to the trench 15 through the drift region 11 and the substrate 10.

The field plate electrode 21 in the first trench 15 is connected to the source electrode 26 at the same potential or is in a floating state and has a function to relax concentration of an electric field in the vicinity of the gate terminal. The field plate electrode 21 is made of a conductive material such as a metal, a metal alloy, or a polycrystal semiconductor such as polysilicon.

The insulating film 30 in the trench 15 is made of, for example, an oxide film made of silicon dioxide, a nitride film made of silicon nitride, or a mixed film of the oxide film and the nitride film.

The MOSFET is configured with the gate electrode 20, the field plate electrode 21, and the insulating film 30 which are formed in the trench 15, the source region 13 and the body region 12 adjacent to the trench 15, the drift region 11 and the substrate 10 which are located below the body region 12, the source electrode 26, and the drain electrode 27.

The conductive plug 25 penetrates through the interlayer insulating film 31 formed above the body region 12 between two trenches 15 adjacent to each other and reaches the interior of the body region 12, and is electrically connected to the source region 13 and the body region 12 which are formed between two trenches 15.

The conductive plug 25 may not extend to the interior of the semiconductor substrate S. For example, in the front surface of the semiconductor substrate S, the conductive plug 25 may be electrically connected to the source region 13 and the body region 12 by coming in contact therewith.

The conductive plug 25 includes a silicon layer 23 made of silicon other than a single crystal, silicide crystallites 24 contained in the silicon layer 23, and a blocking layer 22 that is formed to cover sides of the silicon layer 23 and is made of a material, which is impervious to the silicide crystallites 24.

The silicon layer 23 is made of polycrystalline silicon such as polysilicon or non-crystalline silicon such as amorphous silicon, and contains the silicide crystallites 24 therein.

The silicide crystallites 24 are compounds composed of metal particles capable of shortening a carrier lifetime of the interior of the semiconductor substrate S and the silicon included in the silicon layer 23. The metal particles are heavy metals such as Pt (platinum), Pd (palladium), V (vanadium), Ir (iridium), or Au (gold).

The blocking layer 22 is made of a conductive material, for example, titanium nitride, tantalum nitride, and tungsten nitride.

The conductive plug 25 is formed as follows, for example.

After components in the semiconductor substrate S, the interlayer insulating film 31 is formed on the front surface of the semiconductor substrate S by using a CVD method, the trench is formed by etching of the interlayer insulating film 31 and the front surface of the semiconductor substrate S, and then the blocking layer 22 is formed in the trench by using a sputtering method. Thereafter, a space is obtained in the trench by etching a portion of the blocking layer 22, and silicon and metal are deposited in the space by a CVD method, thereby forming the silicon layer 23.

After the conductive plug 25 is formed, a film made of a conductive material is formed on the exposed surface of the conductive plug 25 and the surface of the interlayer insulating film 31 by using a sputtering method to make the source electrode 26, and then the semiconductor device 100 is completed by heating of the semiconductor device 100.

By such a heating process, the silicide crystallites 24 contained in the silicon layer 23 are diffused into the semiconductor substrate S, and thus the carrier lifetime is shortened. The silicide crystallites 24 are not diffused into the interlayer insulating film 31 through the blocking layer 22, but is diffused into the semiconductor substrate S from a lower surface of the silicon layer 23 through the silicon layer 23 surrounded by the blocking layer 22.

As described above, according to the semiconductor device 100, since the silicide crystallites 24 are diffused into only the semiconductor substrate S, the carrier lifetime can be easily adjusted. Further, since the silicide crystallites 24 are prevented from being diffused into the interlayer insulating film 31, it is possible to stabilize characteristics of the semiconductor device 100.

Figure 2:
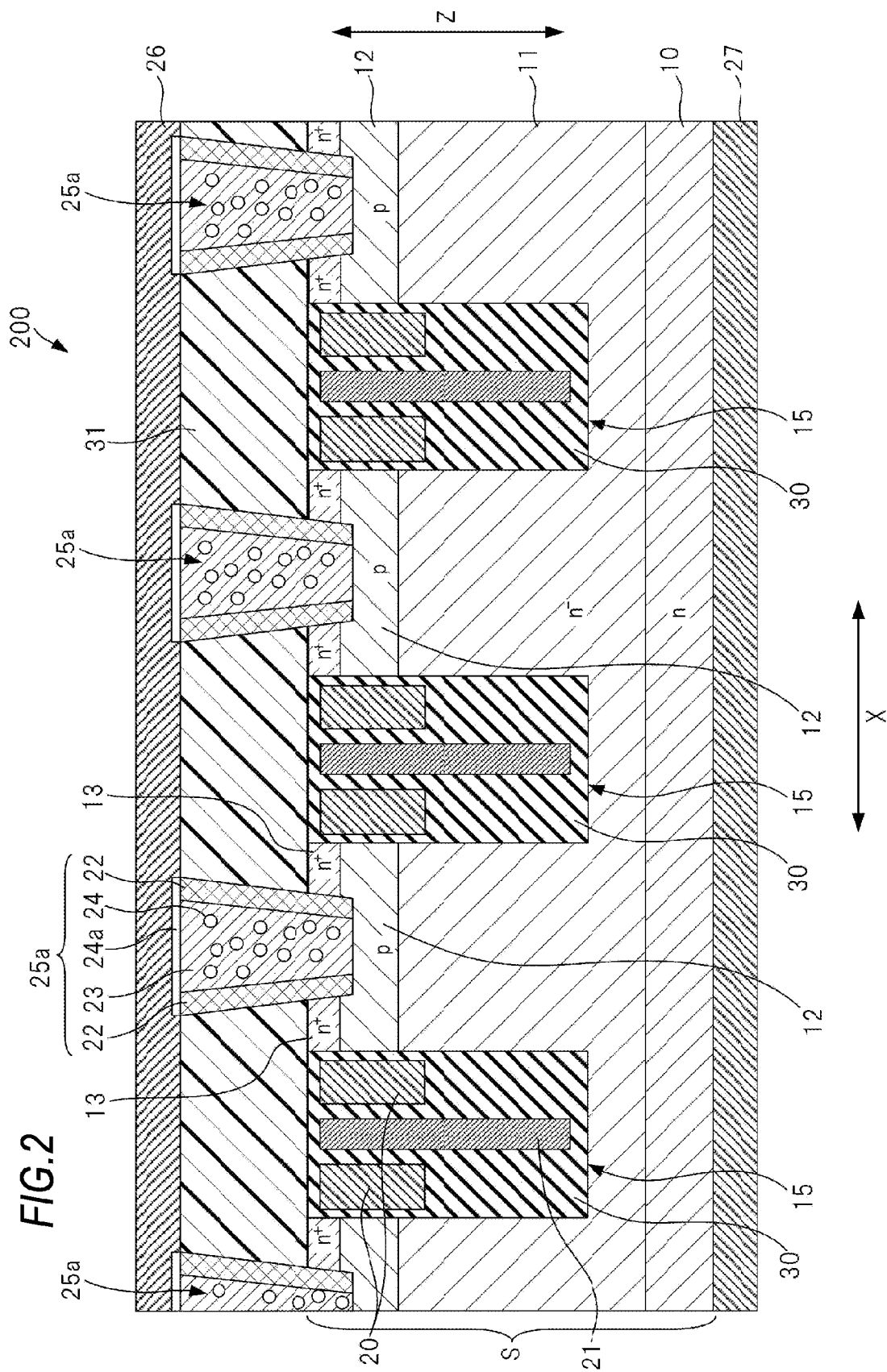
FIG. 2 is a schematic cross-sectional view illustrating partially a schematic configuration of a semiconductor device 200 according to a second embodiment of this disclosure.

FIG. 2 is a schematic cross-sectional view illustrating partially a schematic configuration of a semiconductor device 200 according to a second embodiment of this disclosure. In FIG. 2, the same components as in FIG. 1 are denoted by same reference numerals, and will not be presented.

The semiconductor device 200 has the same configuration as that of the semiconductor device 100 except that the conductive plug 25 is changed into a conductive plug 25a.

The conductive plug 25a is configured with a blocking layer 22, a silicon layer 23 including silicide crystallites 24, and a metal film 24a.

The metal film 24a is formed between the blocking layer 22 and the silicon layer 23 and the source electrode 26 and is made of a metal material. The metal film 24a is made of a material (for example, a heavy metal such as Pt (platinum), Pd (palladium), V (vanadium), Ir (iridium), or Au (gold)) such as a metal forming the silicide crystallite 24.

The conductive plug 25a is formed as follows, for example.

After forming components in the semiconductor substrate S, the interlayer insulating film 31 is formed on the front surface of the semiconductor substrate S by using a CVD method, the trench is formed by etching of the interlayer insulating film 31 and the front surface of the semiconductor substrate S, and then the blocking layer 22 is formed in the trench by using a sputtering method. Thereafter, a space is obtained in the trench by etching a portion of the blocking layer 22, and silicon are deposited in the space by a CVD method, thereby forming the silicon layer 23.

Subsequently, a metal film made of a metal material is formed on the surface of the blocking layer 22 and the surface of the silicon layer 23 and the surface of the interlayer insulating film 31 by using a sputtering method, and the metal film is patterned by, for example, a photolithography method and etching, thereby forming the metal film 24a.

After the conductive plug 25a is formed, a film made of a conductive material is formed on the exposed surface of the conductive plug 25a and the surface of the interlayer insulating film 31 using a sputtering method to make the source electrode 26, and then the semiconductor device 200 is completed by heating of the semiconductor device 200 in the halfway of preparation.

By such a heating process, metal crystallites contained in the metal film 24a are diffused into the silicon layer 23, and thus the silicide crystallites 24 are formed. The silicide crystallites 24 are diffused into the semiconductor substrate S, and thus the carrier lifetime is shortened. The silicide crystallites 24 are not diffused into the interlayer insulating film 31 through the blocking layer 22, but are diffused into the semiconductor substrate S from a lower surface of the silicon layer 23 through the silicon layer 23 surrounded by the blocking layer 22.

As described above, according to the semiconductor device 200, since the silicide crystallites 24 are diffused into only the semiconductor substrate S, the carrier lifetime can be easily adjusted. Further, since the silicide crystallites 24 are prevented from being diffused into the interlayer insulating film 31, it is possible to stabilize characteristics of the semiconductor device 100.

According to the semiconductor device 200, the silicide crystallites 24 do not exist in the silicon layer 23 of the conductive plug 25a before the heating process is performed. For this reason, stress to be applied to the semiconductor substrate S can be reduced, and the characteristics of the semiconductor device 200 can be stabilized.

According to the semiconductor device 200, since the metal crystallites are diffused from the metal film 24a, a uniform amount of silicide particles can be diffused into the semiconductor substrate S in all of the MOSFETs, and the characteristics can be stabilized.

Figure 3:
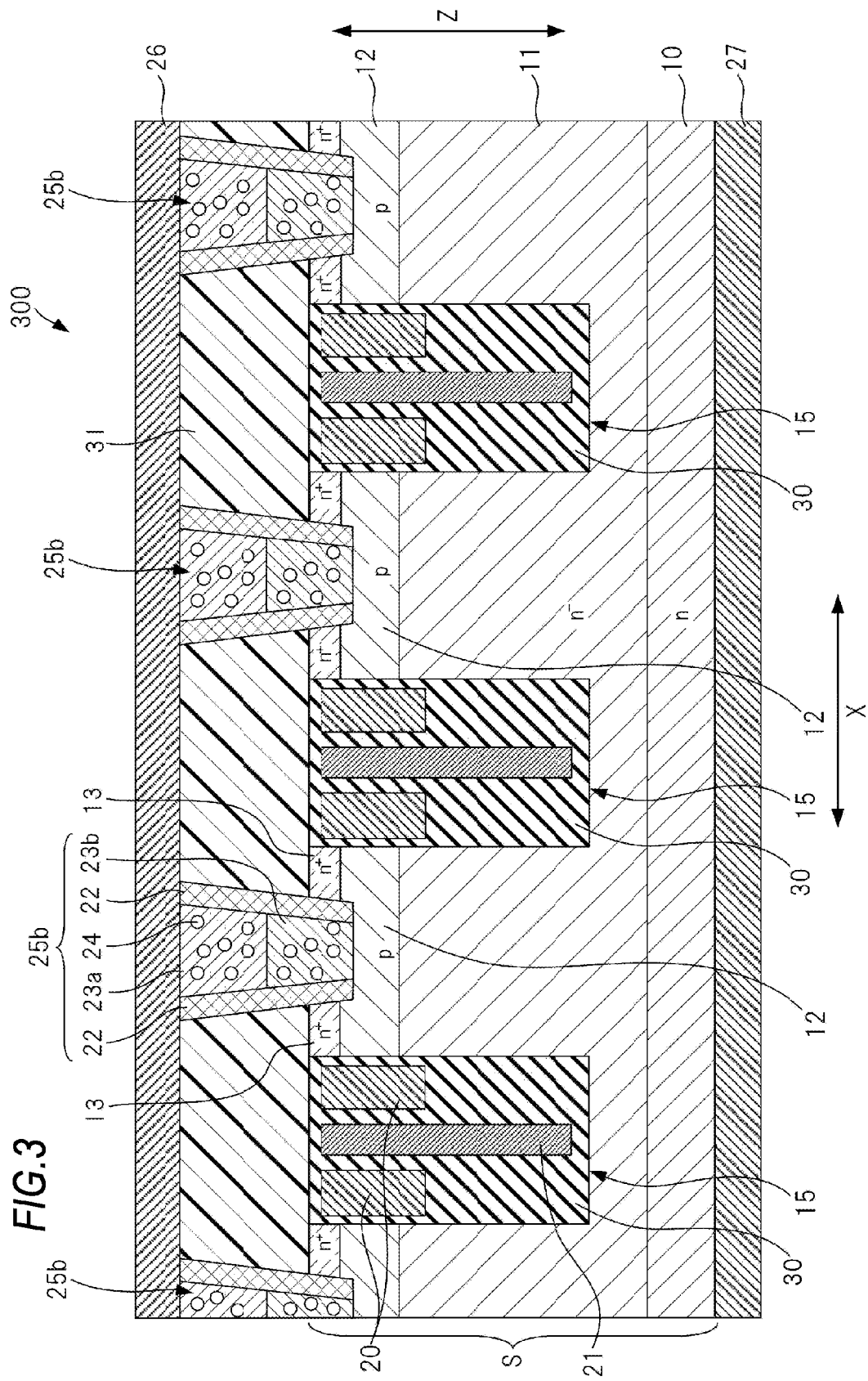
FIG. 3 is a schematic cross-sectional view illustrating partially a schematic configuration of a semiconductor device 300 according to a third embodiment of this disclosure.

FIG. 3 is a schematic cross-sectional view illustrating partially a schematic configuration of a semiconductor device 300 according to a third embodiment of this disclosure. In FIG. 3, the same components as in FIG. 1 are denoted by same reference numerals, and will not be presented.

The semiconductor device 300 has the same configuration as that of the semiconductor device 100 except that the conductive plug 25 is changed into a conductive plug 25b.

The conductive plug 25b has the same configuration as that of the conductive plug 25 except that the silicon layer 23 has a laminate structure of a first layer 23a containing silicide crystallites 24 and a second layer 23b containing silicide crystallites 24.

The second layer 23b is made of non-crystalline silicon such as amorphous silicon.

The first layer 23a is formed on the second layer 23b, and is made of polycrystalline silicon such as polysilicon.

According to the semiconductor device 300, since the silicon layer of the conductive plug 25b has the laminate structure of the non-crystalline silicon and the polycrystalline silicon, the conductivity of the conductive plug 25b can be improved due to the non-crystalline silicon, and stress to be applied to the semiconductor substrate S can also be reduced.

Since the polycrystalline silicon can be formed with a short time, the conductive plug 25b can be formed with a short time, compared to the case where the silicon layer of the conductive plug 25b is formed of only the non-crystalline silicon, and manufacturing costs of the semiconductor device 300 can be reduced.

According to the semiconductor device 300, since the second layer 23b made of the non-crystalline silicon is formed in a portion at which the conductive plug 25b is buried in the semiconductor substrate S, stress to be applied to the semiconductor substrate S can be reduced, compared to a configuration in which the first layer 23a and the second layer 23b are reversely positioned.

According to the semiconductor device 300, even when the first layer 23a and the second layer 23b are reversely positioned, it is possible to obtain the effects of reduction in stress and fabricating cost. If the first layer 23a and the second layer 23b are positioned alternately to form multilayer structure, stress that is to be applied to the semiconductor substrate can be reduced furthermore. In such a structure, it is desirable to position the second layer 23b at the bottom of the plug connecting to the body region 12, to position the first layer 23a at the surface of the plug connecting to the source electrode 26. According to such a configuration, the connection between source electrode and the plug becomes better and results in reliability, and the silicide crystallite can be smoothly diffused into silicon.

The silicon layer 23 of the semiconductor device 300 may be replaced with the laminate structure of the first layer 23a and the second layer 23b illustrated in FIG. 3. With such a configuration, it is possible to stabilize the characteristics, reduce the fabricating costs, and reduce the stress.

As the transistor included in the semiconductor device 100, 200, or 300, the MOSFET is exemplified in the above description. However, even when the transistor is an IGBT, the similar effects can be obtained with the similar configuration.

In the semiconductor device, 200, or 300, the blocking layer 22 has conductivity. However, the blocking layer 22 may not have conductivity.

Figure 4:
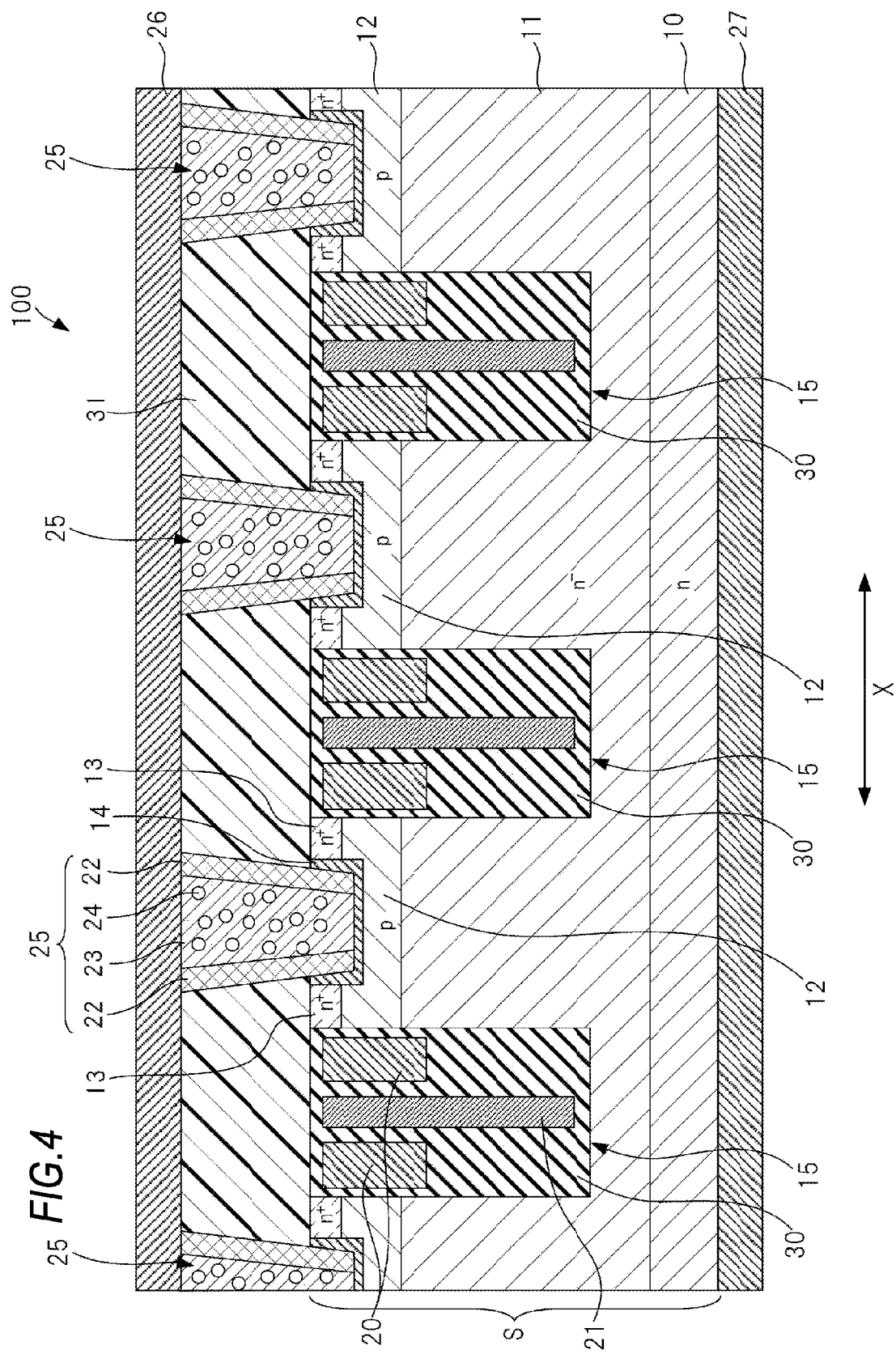
FIG. 4 is a schematic cross-sectional view illustrating a modified example of the semiconductor device 100 illustrated in FIG. 1.

In this case, as illustrated in FIG. 4, a silicide layer 14 is formed in the semiconductor substrate S between two trenches 15 adjacent to each other and comes in contact with the source region 13 and the body region 12, the silicon layer 23 of the conductive plug 25 comes in contact with the silicide layer 14, and thus the silicon layer 23 may be electrically connected to the source region 13 and the body region 12.

With the configuration in which the blocking layer 22 has the conductivity, the process of forming the silicide layer 14 illustrated in FIG. 4 can be omitted, and thus fabricating costs of the semiconductor device can be reduced.

In the semiconductor devices illustrated in FIGS. 1 to 4, even when the p-type and the n-type of the impurity regions in the semiconductor substrate S are reversed, the above-described effects can be obtained.

What is claimed is:

1. A semiconductor device comprising:
   a trench, which is formed on a front surface of a semiconductor substrate;
   a first electrode, which is formed in the trench;
   a first impurity region, which has a first conductivity type and is formed to abut on the trench, in the front surface of the semiconductor substrate;
   a second impurity region, which has a second conductivity type and is formed to abut the trench, below the first impurity region, the second conductivity type being opposite to the first conductivity type;
   an insulating film, which is formed on the front surface of the semiconductor substrate;
   a conductive plug, which is formed to penetrate through the insulating film and is electrically connected to the first impurity region and the second impurity region; and
   a second electrode, which is formed on the conductive plug and is electrically connected to the conductive plug,
   wherein the conductive plug includes:
   a silicon layer made of silicon other than a single crystal;
   a silicide crystallite contained in the silicon layer; and
   a blocking layer that is formed to cover sides of the silicon layer and is made of a material that is impervious to the silicide crystallite.

2. The semiconductor device according to claim 1, wherein the silicon layer has a laminate structure of a first layer made of polycrystalline silicon and a second layer made of non-crystalline silicon.

3. The semiconductor device according to claim 2, wherein the silicon layer has a structure in which the first layer is laminated on the second layer.

4. The semiconductor device according to claim 3, wherein the first layer and the second layer are alternately laminated,
   wherein the first layer is positioned at a front surface of the conductive plug connecting to a source metal, and
   wherein the second layer is positioned at a bottom of the conductive plug connecting to a body region.

5. The semiconductor device according to claim 1, wherein the blocking layer has conductivity.

6. The semiconductor device according to claim 5, wherein the blocking layer is made of titanium nitride.

7. The semiconductor device according to claim 1, wherein the blocking layer has conductivity and comes in contact with the first impurity region and the second impurity region, and
   wherein the silicon layer has a lower surface coming in contact with the second impurity region.

8. The semiconductor device according to claim 1, wherein the conductive plug further includes a metal film that is formed on the silicon layer and the blocking layer.

* * * * *